(12) United States Patent
Lin

(10) Patent No.: US 6,727,543 B2
(45) Date of Patent: Apr. 27, 2004

(54) METHOD FOR FABRICATING A MEMORY STRUCTURE HAVING REQUIRED SCALE SPACERS

(76) Inventor: Yung-Chang Lin, 416, Yuan-Huan E. Rd., Feng-Yuan, Taichung (TW)

(*) Notice: Subject to any disclaimer, the term of this patent is extended or adjusted under 35 U.S.C. 154(b) by 0 days.

(21) Appl. No.: 10/286,099

(22) Filed: Oct. 31, 2002

(65) Prior Publication Data

US 2003/0234419 A1 Dec. 25, 2003

Related U.S. Application Data

(62) Division of application No. 10/177,599, filed on Jun. 19, 2002.

(51) Int. Cl.[7] .............................................. H01L 21/302
(52) U.S. Cl. ........................ 257/314; 438/637; 438/299; 438/595
(58) Field of Search ............................... 438/211, 257, 438/639, 637, 241, 299, 696, 702, 791, 595, 264, 629, 634, 622, 656; 257/387, 640, 774

(56) References Cited

U.S. PATENT DOCUMENTS 6,165,857 A  * 12/2000 Yeh et al. ................... 438/303
6,306,760 B1 * 10/2001 Hsu et al. ................... 438/639

* cited by examiner

Primary Examiner—Jack Chen
Assistant Examiner—Yennhu B. Hyunh
(74) Attorney, Agent, or Firm—Merchant & Gould P.C.

(57) ABSTRACT

A memory structure and the method for fabricating the same are disclosed in this present invention. A first gate structure and a second gate structure are provided onto a substrate. After an implanting process, the first gate structure will become the periphery device of an embedded memory structure, and the second gate structure will become the memory device of the embedded memory structure. A first spacer and a second spacer are fabricated on the sidewalls of the first gate structure and the second gate structure. After the formation of the contacts between the second gate structures, the second spacer on the sidewall of the second gate structure will be removed. Therefore, there is the dual spacer, including the first spacer and the second spacer, on the sidewall of the first gate structure. In the other hand, the single spacer, only the first spacer included, is left on the sidewall of the second gate structure. Therefore, this invention can fabricate the spacers in different scale based on the requirement of the semiconductor manufacture for the periphery device and the memory device.

7 Claims, 4 Drawing Sheets

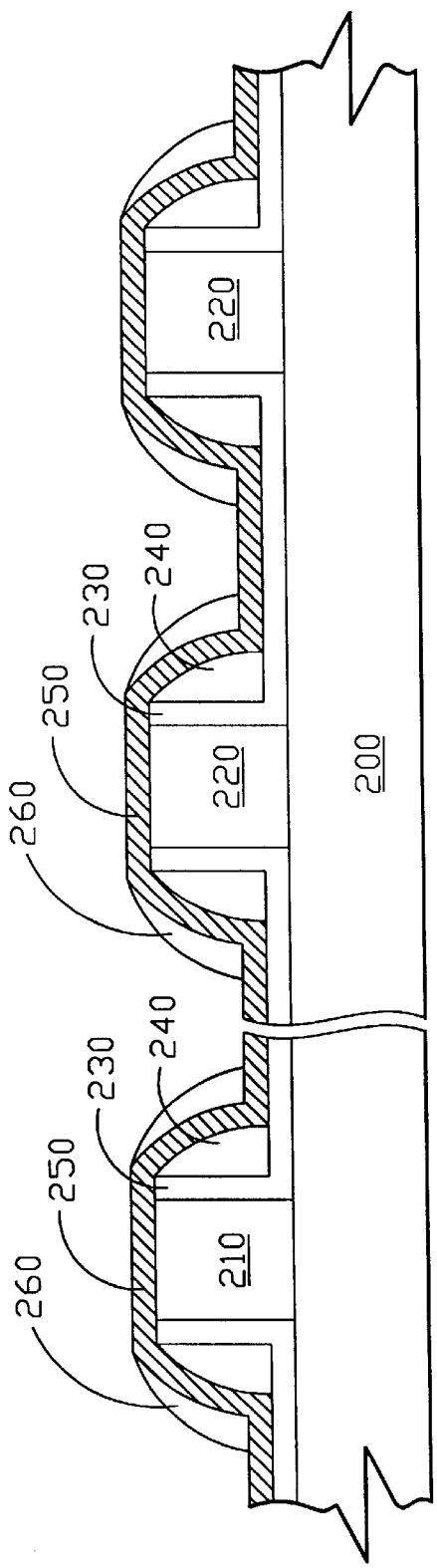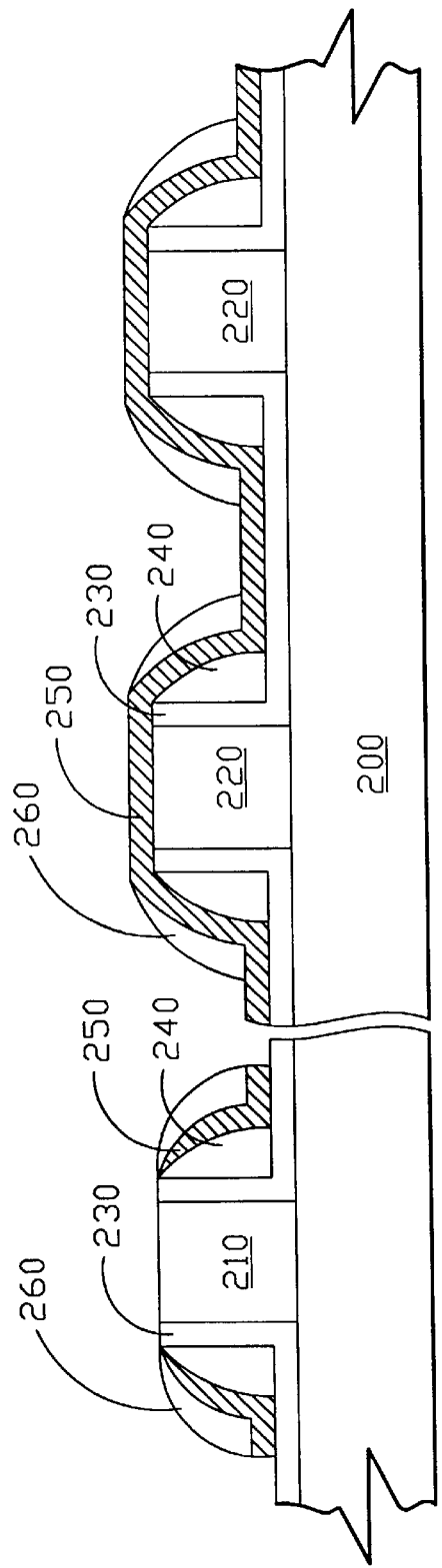

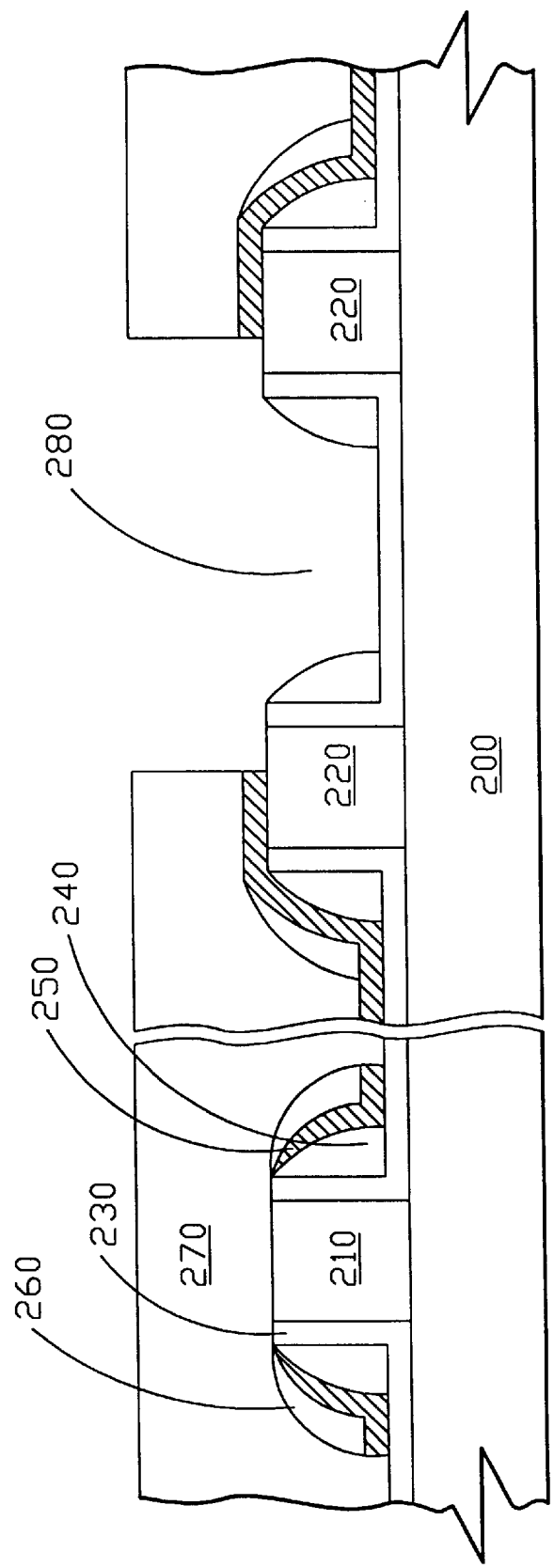

METHOD FOR FABRICATING A MEMORY STRUCTURE HAVING REQUIRED SCALE SPACERS

This application is a divisional of application Ser. No. 10/177,599, filed Jun. 19, 2002, which application(s) are incorporated herein by reference.

BACKGROUND OF THE INVENTION

1. Field of the Invention

This present invention relates to a semiconductor structure. More particularly, this present invention relates to a memory structure and the method for manufacturing the same.

2. Description of the Prior Art

With the increasing integration of semiconductor structure, the technology of forming an embedded memory structure, such as an embedded dynamic random access memory (embedded DRAM), is more and more important. However, the formation of the spacers in an embedded memory structure is a challenge in the manufacturing of the above-mentioned structure. The requirement of the scale of the spacers is different for the memory device and for the periphery device. In the case of the embedded DRAM, based on the element requirement, such as the implanting requirement, the spacer of the logic device must be a bigger one. On the other hand, the spacer of the DRAM is a smaller one, and the following process, such as the contact formation, will not be affected by the spacer of the DRAM.

Hence, in order to improve the efficiency of the embedded memory structure, it is an important object to provide an embedded memory structure with the spacers in required scale for the periphery device and the memory device, and the method for manufacturing the above-mentioned embedded memory structure.

SUMMARY OF THE INVENTION

In accordance with the present invention, a method is provided for fabricating a memory structure so that the spacers of the periphery device and the memory device in the above-mentioned embedded memory structure can be formed in required scale respectively.

It is another object of this invention to disclose a memory structure with the spacers in the required scale for the periphery device and the memory device in the memory structure, and thus the spacers in the embedded memory structure can attach the requirement of the semiconductor manufacture.

In accordance with the above-mentioned objects, the invention discloses a memory structure and the method for manufacturing the same. According to this prevent invention, at least a first gate structure and at least a second gate structure are provided on a substrate. After an implanting process, the first gate structure will become a periphery device, and the second gate structure will become a memory device of an embedded memory structure. A first spacer is formed on the sidewall of the first gate structure and the sidewall of the second gate structure. Next, a second spacer is formed on the sidewall of the first gate structure and the sidewall of the second gate structure. After the formation of the contact between the memory devices, the second spacer on the sidewall of the second gate structure is removed. As a result of the above-mentioned steps, an embedded memory structure with spacers in different scale is formed thereby. The spacer on the sidewall of the first gate structure comprises the first spacer and the second spacer. The spacer on the sidewall of the second gate structure only comprises the first spacer. Therefore, it is notably that an embedded memory structure with spacers in required scale for the periphery device and the memory device can be formed thereby, and following process will not be affected by the spacers in the embedded memory structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A to 2E depict the formation of an embedded memory structure according to this presented invention.

DESCRIPTION OF THE PREFERRED EMBODIMENTS

Figure 1:
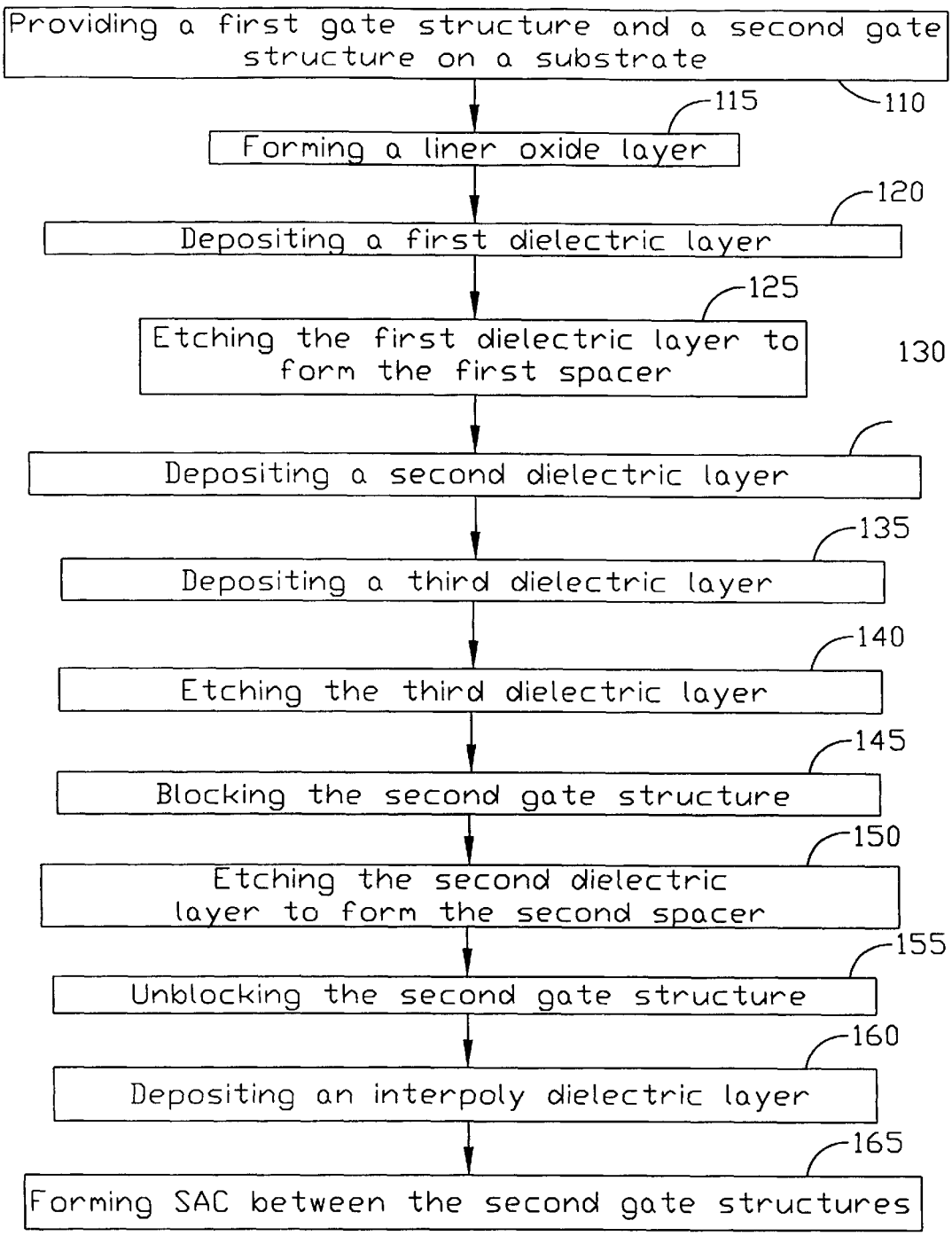
FIG. 1 is a flowchart showing the method for fabricating an embedded memory structure according to this present invention.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Then, the components of the semiconductor devices are not shown to scale. Some dimensions are exaggerated to the related components to provide a more clear description and comprehension of the present invention.

One preferred embodiment of this invention is a method for fabricating an embedded memory structure. At first, at least one first gate structure of a periphery device and at least one second gate structure of a memory device is provides onto a substrate. After an implanting process, the first gate structure will become a logic device or the like periphery device, and the second gate structure will become a dynamic random access memory (DRAM) or the like memory device. The first spacers are formed on the sidewalls of the first gate structure and the second gate structure. After forming a first dielectric layer onto the substrate, the first gate structure, and the second gate structure, and removing portion of the first dielectric layer, the first spacers are formed on the sidewalls of the first gate structure and the second gate structure respectively.

Subsequently, a second dielectric layer is formed onto the substrate, the first gate structure, the second gate structure, and the first spacers. A third dielectric layer is formed onto the second dielectric layer. SiON or other dielectric materials is used as the second dielectric layer, wherein the above-mentioned dielectric materials have an etching rate between the etching rate of the first dielectric layer and the etching rate of the third dielectric layer. The third dielectric layer may be silicon oxide or other dielectric materials. The second gate structure is blocked, and an etching process is performed to fabricate the second spacers on the sidewalls of the first gate structure. Then, the second gate structure is unblocked, and an interpoly dielectric layer (IPD) is deposited on the substrate, the first gate structure, and the second gate structure. The interpoly dielectric layer may be made of silicon oxide, silicon nitride, or the like materials. Finally, a step for fabricating self-alignment contact (SAC) is performed between the second gate structures.

In this embodiment, two spacers are formed on the sidewalls of the first gate structure. The first spacer comprises the first dielectric layer, and the second spacer comprises the second dielectric layer and the third dielectric layer. For the second gate structure, only the first spacer is left on the sidewalls of the second gate structure. In the process for forming the self-alignment contact, the second dielectric layer is used as an etching buffer layer. In other words, the second spacer on the sidewall of the second gate structure will be removed during the formation of the self-alignment contact. Therefore, the method in this embodiment can fabricate the spacers in different size onto the sidewalls of the different gate structure.

Another preferred embodiment of this present invention is a method for fabricating an embedded memory structure. FIG. 1 depicts a flowchart for manufacturing dual spacer in a semiconductor structure. At first, at least a first gate structure and at least a second gate structure are provided on a substrate, as shown in the step 110. After an implanting process for implanting ions into the substrate, the first gate structure will become a logic device, or other periphery device, and the second gate structure will become a dynamic random access memory (DRAM), or other memory device. As the step 115, a liner oxide layer is formed onto the substrate, the first gate structure, and the second gate structure. A first dielectric layer is formed onto the liner oxide layer, as the step 120. The first dielectric layer may be consisted of silicon nitride, or other dielectric materials. In the step 125, the first dielectric layer is etched for removing portion of the first dielectric layer to fabricate the first spacers onto the sidewalls of the first gate structure and the second gate structure.

A second dielectric layer is formed on the first gate structure, and the second gate structure, as the step 130. A third dielectric layer is formed onto the second dielectric layer, as shown in the step 135. The second dielectric layer may be silicon oxide nitride (SiON), or other dielectric materials with an etching rate between the etching rate of the first dielectric layer and the etching rate of the third dielectric layer. The third dielectric layer may be made of silicon oxide, or other dielectric materials. An etching step is performed to remove portion of the third dielectric layer. Then, the second gate structure is blocked, as the step 145, and an etching process is performed to remove portion of the second dielectric layer, as the step 150, for fabricating the second spacer onto the sidewalls of the first gate structure.

As the step 155, the second gate structure is unblocked. After unblocking the second gate structure, an implanting process may be performed to form the source region and the drain region of the memory device. Subsequently, an interpoly dielectric layer (IPD) is deposited on the substrate, the first gate structure, and the second gate structure, as the step 160. While the deposition of the interpoly dielectric layer, the third dielectric layer on the sidewalls of second gate structure is good for preventing the voids formed between the second gate structures. Finally, as the step 165, a self-alignment contact (SAC) is fabricated between two of the second gate structure to form the bit lines of the semiconductor structure. The second dielectric layer is employed as the etching buffer layer during the formation of the self-alignment contact.

In this manner, after the formation of the self-alignment contact, the second dielectric layer and the third dielectric layer on the sidewalls of the second gate structure are removed. In other words, only the first spacer is left on the sidewalls of the second gate structure. Therefore, the method according to this invention can adjust the scale of the spacers of the periphery device and the memory device based on the requirement. For example, in this embodiment, dual spacer, the first spacer and the second spacer, is fabricated on the sidewalls of the periphery device. In the other hand, the single spacer, only the first spacer, is produced on the sidewalls of the memory device. The above-mentioned first spacer comprises the first dielectric layer, and the above-mentioned second spacer comprises the second dielectric layer and the third dielectric layer.

Figure 2A:
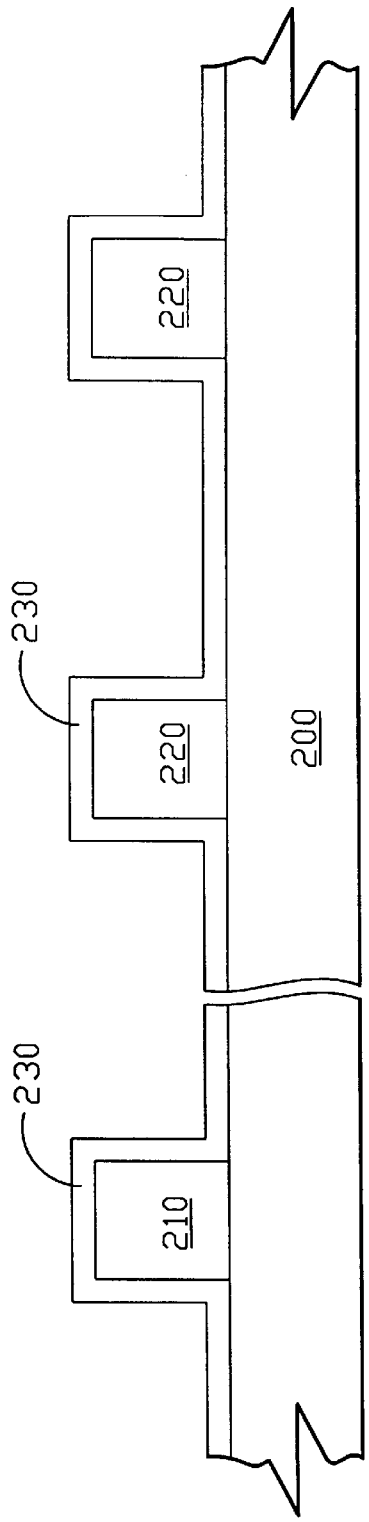

Another preferred embodiment according to this invention is about an embedded memory structure. FIG. 2A to FIG. 2E depict the formation of the above-mentioned embedded memory structure. As shown in FIG. 2A, at least a first gate structure 210 of a periphery device and at least a second gate structure 220 of a memory device are formed on a substrate 200. After implanting the ions into the substrate 200, not shown in the figure, the first gate structure 210 will become a logic device or other periphery device, and the second gate structure 220 will become a dynamic random access memory (DRAM), or other memory device. A liner oxide layer 230 is formed onto the substrate 200, the first gate structure 210, and the second gate structure 220. The thickness of the liner oxide layer 230 is about 50 to 150 angstrom.

Figure 2B:
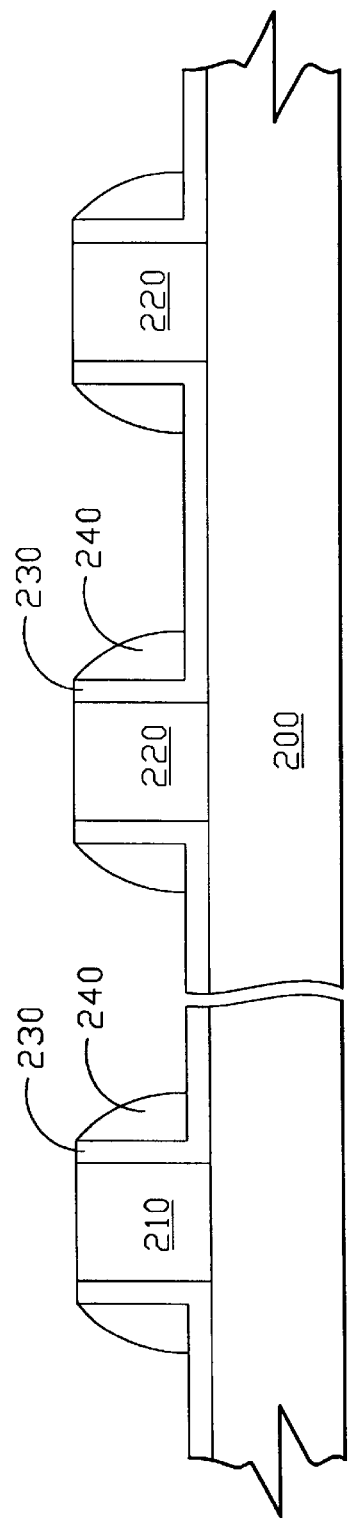

A first dielectric layer 240 is formed onto the liner oxide layer 230. The first dielectric layer 240 may be consisted of silicon nitride, or other dielectric materials. The first dielectric layer 240 is etched by an original technology, and the first spacer is fabricated onto the sidewalls of the first gate structure 210 and the second gate structure 220, as shown in FIG. 2B. The first spacer comprises the liner oxide layer 230 and the first dielectric layer 240.

A second dielectric layer 250 is formed on the liner oxide layer 230, the first gate structure 210, and the second gate structure 220. A third dielectric layer 260 is formed onto the second dielectric layer 250. An etching process is performed to remove portion of the third dielectric layer 260, as shown in FIG. 2C. The second dielectric layer 250 may be silicon oxide nitride, or other dielectric materials, wherein the etching rate of the second dielectric layer 250 is between the etching rate of the first dielectric layer 240 and the third dielectric layer 260. The thickness of the second dielectric layer 250 is about 200 to 400 angstrom. The third dielectric layer 260 is made of silicon oxide, or other dielectric materials. The thickness of the third dielectric layer 260 is about 200 to 400 angstrom.

Subsequently, the second gate structure 220 is blocked. An etching process is performed to remove portion of the second dielectric layer 250, and the second spacer is fabricated on the sidewalls of the first gate structure 210 thereby, as shown in FIG. 2D. The second spacer comprises the second dielectric layer 250 and the third dielectric layer 260. After the above-mentioned etching process, the second gate structure 220 is unblocked. An implanting process is performed to form the source region and the drain region in the substrate 200, and thus the second gate structure 220 becomes the above-mentioned memory device.

An interpoly dielectric layer 270 is deposited on the substrate 200, the first gate structure 210, and the second gate structures 220, as shown in FIG. 2E. The interpoly dielectric layer 270 may be silicon oxide or other dielectric materials. While the interpoly dielectric layer is deposited, the third dielectric layer 260 on the sidewalls of the second gate structures 220 is helpful to prevent the voids produced between the second gate structures 220. Finally, in order to form a contact between the second gate structures 220, such as a bit line contact, an etching process is performed. With the increasing integration, a self-alignment contact (SAC) technology may be employed to manufacture a contact hole 280 between the second gate structures 220. During the formation of the self-alignment contact, the second dielectric layer 250 is used as an etching buffer layer. After the formation of the self-alignment contact hole 280, the second dielectric layer 250 and the third dielectric layer 260 between the second gate structures 220 are removed. Hence, only the above-mentioned first spacer is left on the sidewalls of the second gate structures 220.

In this embodiment, the spacers on the sidewalls of the periphery device, as the first gate structure 210, and on the sidewalls of the memory device, as the second gate structure 220, are defined in different scale based on the requirement. For the periphery device, the spacers comprise the above-mentioned first spacer and the second spacer. However, for the memory device, only the first spacer is left on the sidewalls of the memory device. Therefore, the larger spacer of the periphery device, including the first spacer and the second spacer, can achieve the requirement of the semiconductor manufacture. Moreover, the smaller spacer, only the first spacer included, will not affect the following manufacture of the semiconductor structure, such as the sell-layout formation. In other words, according to this embodiment, the spacers in different size can be fabricated for the periphery device and the memory device in an embedded memory structure basing on the requirement in the semiconductor structure.

According to the preferred embodiments, this invention discloses an embedded memory structure and the method for fabricating the same. At least a first gate structure of a periphery device and at least a second gate structure of a memory device are provided on a substrate. A first dielectric layer is formed on the substrate, the first gate structure, and the second gate structure. An etching process is performed to fabricate the first spacer on the sidewalls of the first gate structure and the second gate structure. A second dielectric layer and a third dielectric layer is sequentially formed on the substrate, the first gate structure, and the second gate structure. An etching process is performed to remove portion of the third dielectric layer. Then, the second gate structure is blocked, and portion of the second dielectric layer is removed by etching to form the second spacer on the sidewalls of the first gate structure. The second gate structure is unblocked, and the first gate structure and the second gate structure are blanketed with an interpoly dielectric layer. An etching process is performed to fabricate the self-alignment contact between the second gate structures. After the formation of the self-alignment contact, the dual spacer, including the first spacer and the second spacer, is on sidewalls of the periphery device, and the single spacer, only the first spacer included, is on the sidewalls of the memory device. Thus, this present invention can fabricate the spacers in different scale on the sidewalls of the periphery device and the memory device according to the requirement in the semiconductor manufacture.

Although specific embodiments have been illustrated and described, it will be obvious to those skilled in the art that various modifications may be made without departing from what is intended to be limited solely by the appended claims.

What is claimed is:

1. A method for fabricating a memory structure, comprising:
   providing a substrate having a first gate structure, a second gate structure and a third gate structure thereon;
   implanting ions into said substrate;
   forming a first dielectric layer over said first gate structure, said second gate structure and said third gate structure;
   etching said first dielectric layer to form a first spacer on a sidewall of said first gate structure, a sidewall of said second gate structure and a sidewall of said third gate structure;
   forming a second dielectric layer over said first gate structure, said second gate structure and said third gate structure;
   forming a third dielectric layer over said first gate structure, said second gate structure and said third gate structure;
   etching said third dielectric layer to expose said second dielectric layer and form a second spacer adjacent said sidewall of said first gate structure, said sidewall of said second gate structure and said sidewall of said third gate structure;
   removing a portion of said second dielectric layer to expose said first gate structure;
   forming a blanket of interpoly dielectric layer over said substrate; and
   removing a portion of said interpoly dielectric layer, a portion of said third dielectric layer and a portion of said second dielectric layer to form a contact hole between said second gate structure and said third gate structure and expose said substrate, a portion of said second gate structure, a portion of said third gate structure, said first spacer on said sidewall of said second gate structure and said sidewall of said third gate structure.

2. The method according to claim 1, further comprises a step for forming a liner oxide layer on said substrate, said first gate structure, and said second gate structure, before the formation of said first dielectric layer.

3. The method according to claim 1, wherein said first gate structure is a periphery device after an implanting process.

4. The method according to claim 1, wherein said second gate structure and said third gate structure are memory devices after an implanting process.

5. The method according to claim 1, wherein said second dielectric layer is with an etching rate between the etching rate of said first dielectric layer and the etching rate of said third dielectric layer.

6. The method according to claim 1, wherein said second dielectric layer is silicon nitride.

7. The method according to claim 1, wherein said contact hole is formed by a self-alignment contact formation.

* * * * *